United States Patent
Takematsu

(10) Patent No.: US 12,425,055 B2
(45) Date of Patent: Sep. 23, 2025

(54) HIGH FREQUENCY CIRCUIT AND COMMUNICATION APPARATUS

(71) Applicant: Murata Manufacturing Co., Ltd., Nagaokakyo (JP)

(72) Inventor: Yuji Takematsu, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 327 days.

(21) Appl. No.: 18/346,897

(22) Filed: Jul. 5, 2023

(65) Prior Publication Data

US 2024/0106470 A1 Mar. 28, 2024

(30) Foreign Application Priority Data

Sep. 28, 2022 (JP) ................. 2022-155442

(51) Int. Cl.
*H04B 1/04* (2006.01)
*H03F 1/56* (2006.01)
*H03F 3/24* (2006.01)

(52) U.S. Cl.
CPC .............. *H04B 1/04* (2013.01); *H03F 1/565* (2013.01); *H03F 3/245* (2013.01); *H03F 2200/171* (2013.01); *H03F 2200/387* (2013.01); *H03F 2200/451* (2013.01)

(58) Field of Classification Search
CPC .............. H03F 1/565; H03F 2200/171; H03F 2200/387; H03F 2200/451; H03F 3/195; H03F 3/245; H04B 1/04
See application file for complete search history.

(56) References Cited

U.S. PATENT DOCUMENTS

| | | | |
|---|---|---|---|
| 10,148,239 B1* | 12/2018 | Lin | H03F 3/72 |
| 2018/0069574 A1* | 3/2018 | Kondo | H03F 3/72 |
| 2020/0321929 A1* | 10/2020 | Daimon | H03F 3/245 |
| 2020/0395972 A1* | 12/2020 | Matsumoto | H04B 1/401 |
| 2020/0403581 A1* | 12/2020 | Tokuda | H03F 3/72 |

* cited by examiner

*Primary Examiner* — Nguyen T Vo
(74) *Attorney, Agent, or Firm* — XSENSUS LLP

(57) ABSTRACT

A high frequency circuit includes a power amplifier and a matching circuit connected to an output terminal of the power amplifier. The matching circuit includes an inductor connected in series to an output transmission path of the power amplifier, a capacitor connected in series to and between one end of the inductor and the ground, an inductor connected in series to and between the capacitor and the ground, a switch having a common terminal, a selection terminal, and a selection terminal, a capacitor connected in series to and between the common terminal and the one end of the inductor. The selection terminal is connected to the ground, and the selection terminal is connected to the other end of the inductor.

20 Claims, 10 Drawing Sheets

HIGH FREQUENCY CIRCUIT AND COMMUNICATION APPARATUS

CROSS-REFERENCE TO RELATED APPLICATIONS

This application claims priority to Japanese application no. 2022-155442, filed Sep. 28, 2022, the entire contents of which are hereby incorporate by reference.

BACKGROUND

1. Field

The present disclosure relates to a high frequency circuit and a communication apparatus.

2. Description of the Related Art

Conventionally, an antenna matching circuit includes a variable reactance circuit connected between a feeder circuit and an antenna element. The variable reactance circuit of the antenna matching circuit includes reactance elements that are each connected in parallel to or in series to a sending and receiving signal transmission path and switches that performs switching between the connection states of the reactance elements.

SUMMARY

The matching circuit described above is provided with the reactance elements connected in series and parallel and has a large number of elements. In contrast, reducing the number of elements prevents appropriate impedance matching performed in accordance with a signal and leads to a possibility of transmission characteristic deterioration.

In an exemplary aspect, the present disclosure describes a high frequency circuit and a communication apparatus that are enabled to achieve both of reducing the number of elements and improving the transmission characteristics.

A high frequency circuit according to an aspect of the present disclosure includes a power amplifier, and a matching circuit connected to an output terminal of the power amplifier. The matching circuit includes a first inductor connected in series to an output transmission path of the power amplifier, a first capacitor connected in series to and between an end of the first inductor and ground, a second inductor connected in series to and between the first capacitor and the ground, a first switch having a first common terminal, a first selection terminal, and a second selection terminal, and a second capacitor connected in series to and between the first common terminal and the end of the first inductor. The first selection terminal is connected to the ground. The second selection terminal is connected to a different end of the first inductor.

A communication apparatus according to an aspect of the present disclosure includes the high frequency circuit according to the aspect described above, and a RF signal processing circuit that processes a high frequency signal transmitted through the high frequency circuit.

The high frequency circuit and the communication apparatus according to the present disclosure enables both of reducing the number of elements and improving the transmission characteristics.

DETAILED DESCRIPTION

Figure 1:
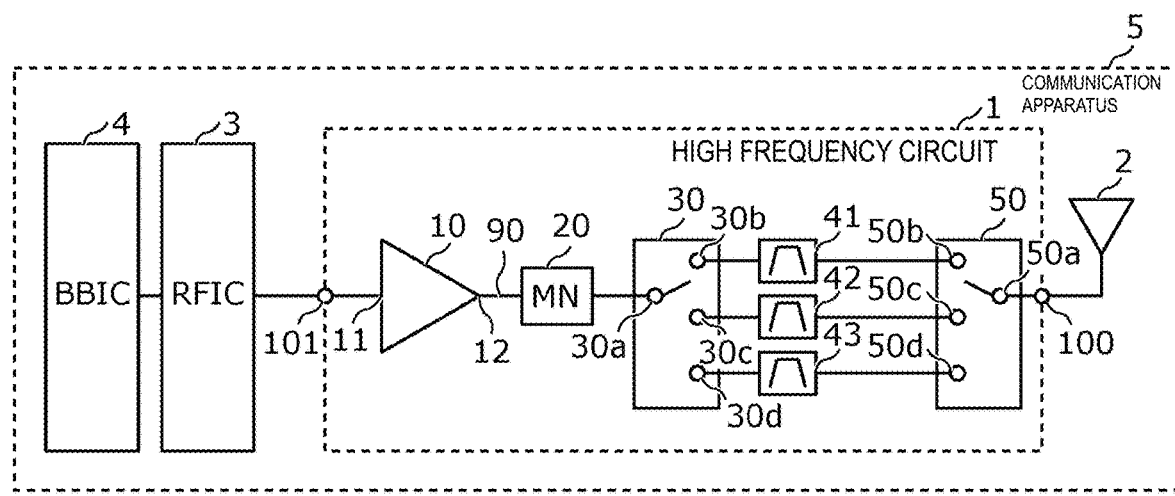
FIG. 1 is a circuit diagram of a high frequency circuit and a communication apparatus according to an exemplary embodiment.

Hereinafter, a high frequency circuit and a communication apparatus according to an embodiment of the present disclosure will be described in detail by using the drawings. The exemplary embodiment to be described later represents a specific example. Accordingly, a numeric value, a shape, a material, a component, the layout and connection form of the component, a step, the order of steps, and the like described in the following embodiment are an example and are not intended to limit the present disclosure. Among components in the following embodiment, a component that is not described in an independent claim is thus described as an optional component.

The drawings are schematic drawings and thus are not necessarily illustrated precisely. Accordingly, for example, reduced scales or the like in the respective drawings do not necessarily correspond to each other. Substantially the same components in the drawings are denoted by the same reference numerals, and overlapping explanation is omitted or simplified.

In this specification, terms representing a relationship between elements such as the phrase "connecting at a right angle", terms representing the shape of an element such as a rectangle or an L, and the range of numerical values are not only expressions used in a strict sense but also as expressions representing a substantially equivalent range, for example, inclusion of a several percentage difference.

In this specification, the term "connected" includes not only "directly connected" but also "electrically connected with another circuit element interposed between one circuit element and the other circuit element". In addition, the term "directly connected" refers not only a case where the terminals of respective components are physically in contact with each other but also a case where the terminals are electrically connected with wiring conductors and/or via conductors interposed therebetween and without another circuit element interposed therebetween.

The term "connected between A and B" denotes that a component is connected between A and B and to both of A and B. The term "connected in series between A and B" denotes that components are electrically connected in series on a wiring path connecting A and B. For example, in a case where C is connected in series to and between A and B, a first terminal of C is connected to A, and a second terminal of C that is different from the first terminal is connected to B.

In this specification, ordinal numerals such as "first" and "second" do not refer to the number of components or the order of the components and are used to avoid confusion of the same types of components and to discriminate therebetween, otherwise particularly stated.

In this specification, the term "sending path" denotes a transmission line including a wiring line through which a high frequency sending signal is transmitted, an electrode directly connected to the wiring line, a terminal directly connected to the wiring line or the electrode, and other components. The term "receiving path" denotes a transmission line including a wiring line through which a high frequency receiving signal is transmitted, an electrode directly connected to the wiring line, a terminal directly connected to the wiring line or the electrode, and other components. The term "sending and receiving path" denotes a transmission line including a wiring line through which both of a high frequency sending signal and a high frequency receiving signal are transmitted, an electrode directly connected to the wiring line, a terminal directly connected to the wiring line or the electrode, and other components.

EMBODIMENT

1 Circuit Configuration of High Frequency Circuit 1 and Communication Apparatus 5

First, the circuit configuration of a high frequency circuit 1 and a communication apparatus 5 according to an exemplary embodiment will be described by using FIG. 1. FIG. 1 is a circuit diagram of the high frequency circuit 1 and the communication apparatus 5 according to this exemplary embodiment.

1.1 Circuit Configuration of Communication Apparatus 5

The circuit configuration of the communication apparatus 5 will first be described. The communication apparatus 5 illustrated in FIG. 1 is an apparatus used in a communication system and is a mobile terminal such as a smartphone or a tablet computer. As illustrated in FIG. 1, the communication apparatus 5 according to this exemplary embodiment includes the high frequency circuit 1, an antenna 2, a radio frequency integrated circuit (RFIC) 3, and a baseband integrated circuit (BBIC) 4.

The high frequency circuit 1 transmits a high frequency signal between the antenna 2 and the RFIC 3. In this exemplary embodiment, the high frequency circuit 1 transmits a sending signal serving as an example of a high frequency signal. The high frequency circuit 1 may transmit a receiving signal serving as an example of the high frequency signal. The detailed configuration of the high frequency circuit 1 will be described later.

The antenna 2 is connected to an antenna connection terminal 100 of the high frequency circuit 1 and sends a high frequency signal output from the high frequency circuit 1. Alternatively, the antenna 2 may receive a high frequency signal from an external apparatus and output the high frequency signal to the high frequency circuit 1.

The RFIC 3 is an example of a signal processing circuit that processes a high frequency signal. Specifically, the RFIC 3 performs signal processing of a sending signal input from the BBIC 4, for example, after upconverting the sending signal and outputs the high frequency sending signal generated by the signal processing to the sending path of the high frequency circuit 1. The RFIC 3 may also perform signal processing of a high frequency receiving signal input through the receiving path of the high frequency circuit 1, for example, by downconverting the high frequency receiving signal and output the receiving signal generated by the signal processing to the BBIC 4. The RFIC 3 also has a control unit that controls switches, an amplifier, and the like of the high frequency circuit 1. Part or all of the functions of the control unit of the RFIC 3 may be implemented outside the RFIC 3, for example, on the BBIC 4 or the high frequency circuit 1.

The BBIC 4 is a baseband signal processing circuit that performs signal processing by using an intermediate frequency band for frequencies lower than the frequency of the high frequency signal transmitted by the high frequency circuit 1. Examples of the signal processed by the BBIC 4 include an image signal for image displaying and/or a voice signal for calling with a speaker.

The circuit configuration of the communication apparatus 5 illustrated FIG. 1 is an example and is not limited to this configuration. For example, the communication apparatus 5 does not have to include the antenna 2 and/or the BBIC 4. The communication apparatus 5 may also include a plurality of antennas 2.

1.2 Circuit Configuration of High Frequency Circuit 1

A specific circuit configuration of the high frequency circuit 1 will then be described by using FIG. 1. As illustrated in FIG. 1, the high frequency circuit 1 includes a power amplifier 10, a matching circuit 20, a switch 30, filters 41, 42, and 43, and a switch 50. The high frequency circuit 1 also has the antenna connection terminal 100 and a high frequency input terminal 101.

The antenna connection terminal 100 is connected to a common terminal 50a of the switch 50 inside the high frequency circuit 1 and is connected to the antenna 2 outside the high frequency circuit 1. A sending signal transmitted through the high frequency circuit 1 is output to the antenna 2 via the antenna connection terminal 100.

The high frequency input terminal 101 is connected to an input terminal 11 of the power amplifier 10 inside the high frequency circuit 1 and is connected to the RFIC 3 outside the high frequency circuit 1. The sending signal received from the RFIC 3 via the high frequency input terminal 101 is thus amplified by the power amplifier 10.

A wiring path connecting the high frequency input terminal 101 and the antenna connection terminal 100 is a transmission path 90 for a high frequency signal. In this exemplary embodiment, the sending signal input from the RFIC 3 is transmitted from the high frequency input terminal 101 to the antenna connection terminal 100 through the transmission path 90.

The power amplifier 10 amplifies the sending signal input from the high frequency input terminal 101. As illustrated in FIG. 1, the power amplifier 10 has the input terminal 11 and an output terminal 12. The input terminal 11 is connected to the high frequency input terminal 101. The output terminal 12 is connected to the matching circuit 20.

The power amplifier 10 includes a bipolar transistor such as a heterojunction bipolar transistor (HBT). Alternatively, the power amplifier 10 may include a field effect transistor (FET) such as a metal oxide semiconductor field effect transistor (MOSFET). The power amplifier 10 may include a plurality of bipolar transistors or a plurality of field effect transistors and may have multi-stage configuration of the transistors.

The matching circuit 20 is connected to the output terminal 12 of the power amplifier 10. Specifically, the matching circuit 20 is connected in series to and between the output terminal 12 and a common terminal 30a of the switch 30. The matching circuit 20 is provided to match the output impedance of the power amplifier 10. The matching circuit 20 also functions as a filter, for example, that attenuates a harmonic wave of a sending signal.

The matching circuit 20 is a variable impedance circuit impedance of which is changeable. The impedance of the matching circuit 20 is changed by a control unit (not illustrated) (or the control unit of the RFIC 3). For example, the impedance of the matching circuit 20 is changed based on the frequency band (communication band), the power, or the like of the sending signal.

A specific circuit configuration of the matching circuit 20 will be described later.

The switch 30 is an example of a second switch having a common terminal and a plurality of selection terminals. As illustrated in FIG. 1, the switch 30 has the common terminal 30a and three selection terminals 30b, 30c, and 30d. The switch 30 performs switching between connection (conduction) and non-connection (non-conduction) of the common terminal 30a to one of the selection terminals 30b, 30c, and 30d. The switch 30 is a single-pole triple-throw (SP3T) switch circuit. The switch 30 is composed of one or more switching elements such as transistors.

The common terminal 30a is an example of a second common terminal and is connected to the matching circuit 20. The common terminal 30a is part of the transmission path 90 for the high frequency signal and is connected to the output terminal 12 of the power amplifier 10 with the matching circuit 20 interposed therebetween. The selection terminal 30b is connected to the input end of the filter 41. The selection terminal 30c is connected to the input end of the filter 42. The selection terminal 30d is connected to the input end of the filter 43.

The filters 41, 42, and 43 have respective pass bands including mutually different communication bands. For example, the filters 41, 42, and 43 are each a sending filter having a pass band including an uplink operating band that is a predetermined communication band.

The communication band is a frequency band for a communication system built up by using radio access technology (RAT). Band A is defined in advance by standardization organizations or the like (such as 3rd Generation Partnership Project (3GPP) (registered trademark) and Institute of Electrical and Electronics Engineers (IEEE)). A 5th generation new radio (5GNR) system, a long term evolution (LTE) system, a wireless local area network (WLAN) system, and the like can be cited as examples of the communication system.

At least one of the filters 41, 42, and 43 may be a sending filter included in a duplexer that enables frequency division duplex (FDD) in the communication band. Alternatively, at least one of the filters 41, 42, and 43 may be a sending and receiving filter that enables time division duplex (TDD).

The filters 41, 42, and 43 may be configured by using any of, for example, a surface acoustic wave (SAW) filter, a bulk acoustic wave (BAW) filter, an LC resonant filter, and a dielectric filter, and further, the configuration is not limited to these filters.

The switch 50 is an example of a third switch having a common terminal and a plurality of selection terminals. The switch 50 has the common terminal 50a and three selection terminals 50b, 50c, and 50d. The switch 50 performs switching between connection (conduction) and non-connection (non-conduction) of the common terminal 50a to one of the selection terminals 50b, 50c, and 50d. The switch 50 is a SP3T switch circuit. The switch 50 is composed of one or more switching elements such as transistors.

The common terminal 50a is connected to the antenna connection terminal 100. The selection terminal 50b is connected to the output end of the filter 41. The selection terminal 50c is connected to the output end of the filter 42. The selection terminal 50d is connected to the output end of the filter 43.

In the high frequency circuit 1 according to this embodiment, switching among connection relationships of each of the switches 30 and 50 is performed based on the frequency band (communication band) or the power of the sending signal. This enables the high frequency signal amplified by the power amplifier 10 to pass through one of the filters 41, 42, and 43. In this exemplary embodiment, the high frequency circuit 1 supporting multiband/multimode may be achieved.

The circuit configuration of the high frequency circuit 1 illustrated in FIG. 1 is an example and is not limited to this configuration. For example, the high frequency circuit 1 does not have to include the switch 30, the filters 41, 42, and 43, and the switch 50. In addition, for example, the high frequency circuit 1 may include only one or two of the filters 41, 42, and 43 and may include one or more filters other than these. The number of selection terminals of each of the switches 30 and 50 may be changed in accordance with the number of filters of the high frequency circuit 1. For example, in the case of two filters, the switches 30 and 50 may each a single-pole double-throw (SPDT) switch circuit. In the case of four filters, the switches 30 and 50 may each a single-pole n-throw (SPnT) switch circuit (multi throw switch circuit). If the high frequency circuit 1 includes only one filter, the high frequency circuit 1 does not have to include the switches 30 and 50.

The high frequency circuit 1 may transmit the receiving signal serving as the example of the high frequency signal as described above. That is, the high frequency circuit 1 may include a sending circuit through which the sending signal is transmitted and a receiving circuit through which the receiving signal is transmitted. In this case, the high frequency circuit 1 includes, for example, a low-noise amplifier (LNA) that amplifies the receiving signal, a high frequency output terminal that outputs the receiving signal, a switch that performs switching between the sending path and the receiving path, a filter, and an impedance matching circuit.

1.3 Circuit Configuration of Matching Circuit 20

Figure 2:
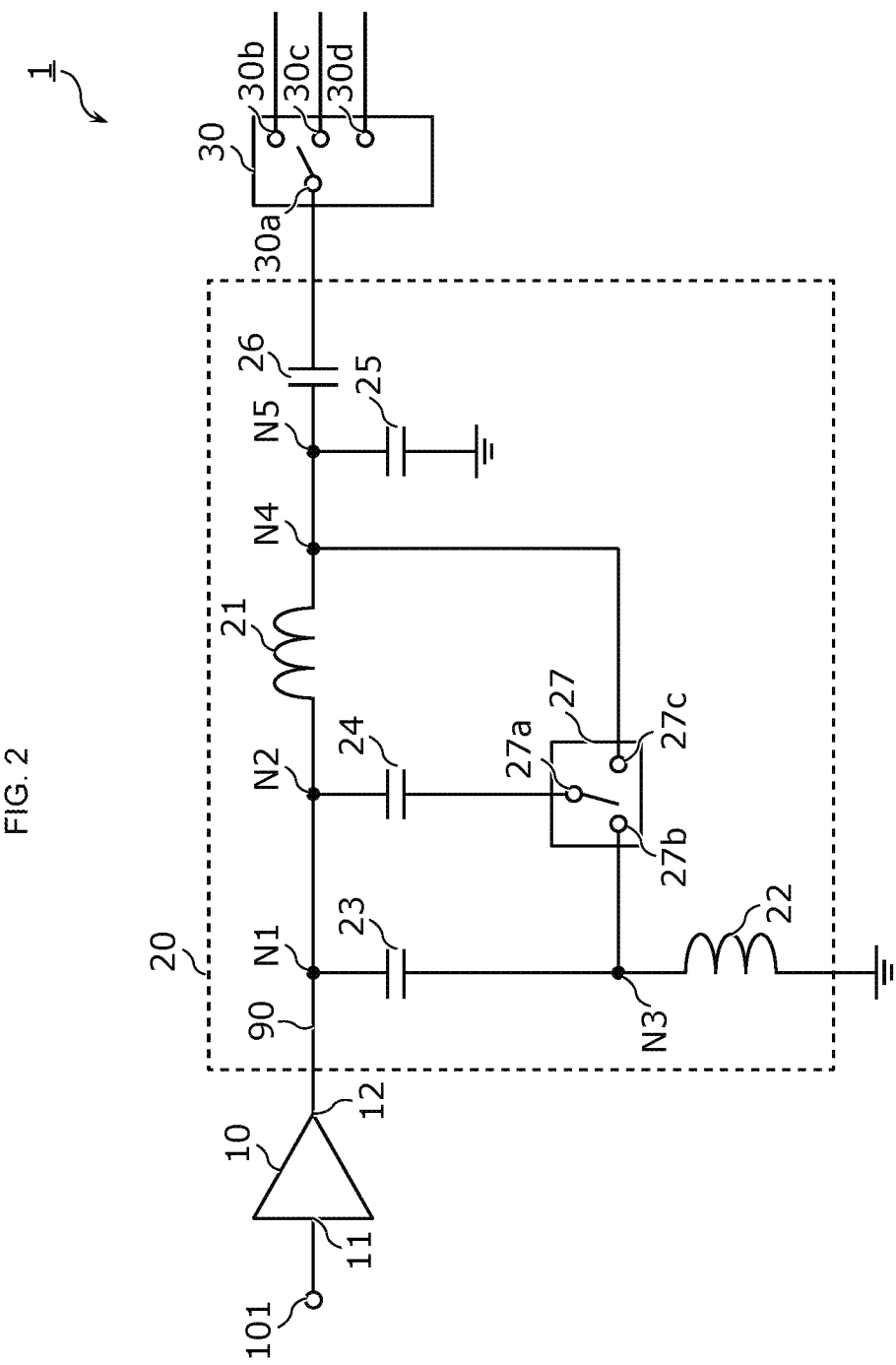
FIG. 2 is a circuit diagram of a matching circuit of the high frequency circuit according to the exemplary embodiment.

A specific circuit configuration of the matching circuit 20 will then be described by using FIG. 2.

FIG. 2 is a circuit diagram of the matching circuit 20 of the high frequency circuit 1 according to this exemplary embodiment. FIG. 2 also illustrates the high frequency input terminal 101, the power amplifier 10, and the switch 30.

As illustrated in FIG. 2, the matching circuit 20 has inductors 21 and 22, capacitors 23, 24, 25, and 26, and a switch 27. The matching circuit 20 also has nodes N1, N2, N3, N4, and N5.

The inductor 21 is an example of a first inductor and is connected in series to an output transmission path of the power amplifier 10. The output transmission path is part of the transmission path 90 and is a portion between the output terminal 12 of the power amplifier 10 and the antenna connection terminal 100. Specifically, the inductor 21 is connected in series to and between the output terminal 12 of the power amplifier 10 and the common terminal 30a of the switch 30. More specifically, one end of the inductor 21 is directly connected to the output terminal 12 of the power amplifier 10, one end of the capacitor 23, and one end of the capacitor 24. The other end of the inductor 21 is directly connected to one end of the capacitor 25 and one end of the capacitor 26. The other end of the inductor 21 is connected to the common terminal 30a of the switch 30 with the capacitor 26 interposed therebetween.

The inductor 22 is an example of a second inductor and is connected in series to and between the capacitor 23 and the ground. One end of the inductor 22 is directly connected to the other end of the capacitor 23 and a selection terminal 27b of the switch 27. The other end of the inductor 22 is directly connected to the ground.

The capacitor 23 is an example of a first capacitor and is connected in series to and between the one end of the inductor 21 and the ground. Specifically, the one end of the capacitor 23 is directly connected to the node N1 on the transmission path 90. The other end of the capacitor 23 is directly connected to the one end of the inductor 22 and the selection terminal 27b of the switch 27.

The capacitor 24 is an example of a second capacitor and is connected in series to and between a common terminal 27a of the switch 27 and the one end of the inductor 21. Specifically, the one end of the capacitor 24 is directly connected to the node N2 on the transmission path 90. The other end of the capacitor 24 is directly connected to the common terminal 27a of the switch 27.

The capacitor 25 is connected to the transmission path 90 for the signal amplified by the power amplifier 10 and between the other end of the inductor 21 and the common terminal 30a of the switch 30. Specifically, the capacitor 25 is an example of a fourth capacitor and is connected in series to and between the other end of the inductor 21 and the ground. More specifically, the one end of the capacitor 25 is directly connected to the node N5 on the transmission path 90. The other end of the capacitor 25 is directly connected to the ground.

The capacitor 26 is an example of a third capacitor and is connected to the transmission path 90 for the signal amplified by the power amplifier 10 and between the other end of the inductor 21 and the common terminal 30a of the switch 30. Specifically, the capacitor 26 is connected in series to and between the other end of the inductor 21 and the common terminal 30a. More specifically, the one end of the capacitor 26 is directly connected to the other end of the inductor 21. The other end of the capacitor 26 is directly connected to the common terminal 30a.

The switch 27 is an example of a first switch and has the common terminal 27a, the selection terminal 27b, and a selection terminal 27c. The switch 27 performs switching between connection (conduction) and non-connection (non-conduction) of the common terminal 27a to one of the selection terminal 27b and the selection terminal 27c. The switch 27 is a SPDT switch circuit. The switch 27 is composed of one or more switching elements such as transistors.

The common terminal 27a is an example of a first common terminal and is connected to the other end of the capacitor 24. The selection terminal 27b is an example of a first selection terminal and is connected to the ground. In this exemplary embodiment, the selection terminal 27b is connected to the ground with the inductor 22 interposed therebetween. Specifically, the selection terminal 27b is directly connected to the node N3. The selection terminal 27c is an example of a second selection terminal and is connected to the other end of the inductor 21. Specifically, the selection terminal 27c is directly connected to the node N4 on the transmission path 90.

The nodes N1, N2, N3, N4, and N5 are each a branch point on the electric circuit. The nodes N1, N2, N3, N4, and N5 are formed from, for example, part of a wiring conductor or a via conductor, or a connection terminal. The nodes N1, N2, N4, and N5 are located on the transmission path 90 for the signal amplified by the power amplifier 10. Specifically, the nodes N1 and N2 are located on the transmission path 90 and between the output terminal 12 of the power amplifier 10 and the one end of the inductor 21. The nodes N4 and N5 are located on the transmission path 90 and between the other end of the inductor 21 and the common terminal 30a of the switch 30. The node N3 is located on the path connecting the transmission path 90 and the ground (shunt path).

Each of the nodes N1, N2, N3, N4, and N5 may be provided at a position different from the illustrated position as long as the potential thereof is regarded as electrically the same. For example, the node N1 may be located between the node N2 and the capacitor 24. The node N2 may be located between the node N1 and the capacitor 23 or may be located between the output terminal 12 of the power amplifier 10 and the node N1. The same holds true for the node N4 and the node N5, and the positions thereof may be changed.

Among the nodes N1, N2, N3, N4, and N5, nodes that can be regarded as having the same potential may form one node. For example, the node N1 and the node N2 may form the same part of a wiring conductor or a via conductor. Specifically, the one end of the capacitor 23 and the one end of the capacitor 24 may be directly connected to the same part of the wiring conductor or the via conductor. The same holds true for the node N4 and the node N5.

The same part is a part of a size that can be regarded as substantially the same as the other. For example, the same part of the wiring conductor or via conductor can be regarded as an area of a square with sides each having the width of the wiring conductor or the diameter or the maximum width of the via conductor.

2 Actions and Effects of Matching Circuit 20

Major actions and effects of the matching circuit 20 will then be described.

In the matching circuit 20, the inductor 21 and the capacitors 23 and 25 form a low pass filter. The inductor 21 is a series element connected in series to the transmission path 90, and the capacitors 23 and 25 are shunt elements connected in series to and between the transmission path 90 and the ground. The harmonic wave of a sending signal may thereby be reduced.

Serial connection of the inductor 22 and the capacitor 23 forms an LC resonant circuit on a shunt path connecting the transmission path 90 and the ground. This causes a specific attenuation pole to occur and thus enables attenuation in a specific frequency band.

The frequency band to be attenuated by the matching circuit 20 is determined based on the characteristics of the sending signal. In the high frequency circuit 1 supporting the multiband/multimode, the frequency band to be attenuated by the matching circuit 20 varies depending on the frequency band (communication band) and/or the power of the sending signal. In the matching circuit 20 according to this embodiment, the attenuation pole of the LC resonant circuit is thus changed by using the switch 27.

Specifically, the switch 27 is capable of switching of a connection target for the common terminal 27a between the selection terminal 27b and the selection terminal 27c based on the frequency band (communication band) or the power of the sending signal. The switching of the connection target is performed by a control unit (not illustrated) or the RFIC 3.

If the common terminal 27a and the selection terminal 27b are connected, the capacitor 24 functions as a shunt element connected to the transmission path 90 and is connected to the ground with the inductor 22 interposed therebetween. In this case, the capacitor 24 is connected in parallel to the capacitor 23. The capacitors 23 and 24 and the inductor 22 thus form an LC resonant circuit (LC serial circuit).

In contrast, if the common terminal 27a and the selection terminal 27c are connected, the capacitor 24 functions as a series element connected to the transmission path 90 and is connected in parallel to the inductor 21. The capacitor 24 and the inductor 21 thus form an LC resonant circuit (LC parallel circuit).

As described above, the matching circuit 20 may configure the LC resonant circuits in respective different circuit configurations by causing the capacitor 24 to function as one of the series element and the shunt element. The switching between the connections of the capacitor 24 may cause the occurrence of a different attenuation pole. By adjusting the inductance value of the inductors 21 and 22 and the capacitance value of the capacitors 23 and 24 in advance, for example, a desired frequency band for a frequency or the like corresponding to the harmonic wave of the sending signal may be attenuated.

Since the one capacitor 24 is shared for two uses, that is, for the series connection and the shunt connection, there is no need for providing respective capacitors specially for the series connection and the shunt connection. The number of capacitors included in the matching circuit 20 (and the high frequency circuit 1) may thus be reduced.

As described above, the high frequency circuit 1 according to this exemplary embodiment includes the power amplifier 10 and the matching circuit 20 connected to the output terminal 12 of the power amplifier 10. The matching circuit 20 has the inductor 21 connected in series to the output transmission path of the power amplifier 10, the capacitor 23 connected in series to and between the one end of the inductor 21 and the ground, the inductor 22 connected in series to and between the capacitor 23 and the ground, the switch 27 having the common terminal 27a, the selection terminal 27b, and the selection terminal 27c, and the capacitor 24 connected in series to and between the common terminal 27a and the one end of the inductor 21. The selection terminal 27b is connected to the ground, and the selection terminal 27c is connected to the other end of the inductor 21.

This enables the capacitor 24 to be shared for the two uses, that is, for the series connection and the shunt connection and thus enables the number of elements of the high frequency circuit 1 to be reduced. In addition, a different LC resonant circuit having a different attenuation pole may thus be formed by changing the connection form of the capacitor 24. The improvement of transmission characteristics such as harmonic wave attenuation may thus be achieved. As described above, the high frequency circuit 1 enables both of reducing the number of elements and improving the transmission characteristics.

For example, the selection terminal 27b is connected to the ground with the inductor 22 interposed therebetween.

If the common terminal 27a and the selection terminal 27b of the switch 27 are connected, an LC resonant circuit connected in series on the shunt path may thereby be formed.

For example, the high frequency circuit 1 includes the switch 30 having the common terminal 30a and the plurality of selection terminals 30b, 30c, and 30d. The common terminal 30a is connected to the other end of the inductor 21.

The switch 30 thereby enables a plurality of output branches from the matching circuit 20. For example, filters having respective different pass bands are connected to the selection terminals 30b, 30c, and 30d of the switch 30, and thereby the high frequency circuit 1 supporting the multiband may be achieved. For example, changing the attenuation pole by using the LC resonant circuit of the matching circuit 20 in the case of a sending signal in a different frequency band enables an unnecessary signal such as a harmonic wave to be attenuated efficiently and the transmission characteristics to be improved.

For example, in the high frequency circuit 1, the matching circuit 20 has the capacitor 25 connected in series to and between the other end of the inductor 21 and the ground.

This enables the impedance matching by the matching circuit 20 to be performed easily.

The communication apparatus 5 according to this exemplary embodiment also includes the high frequency circuit 1 and the RFIC 3 that processes the high frequency signal transmitted through the high frequency circuit 1.

Like the high frequency circuit 1, both of reducing the number of elements and improving the transmission characteristics may thereby be achieved.

3 Element Layout of Matching Circuit 20

Figure 3:
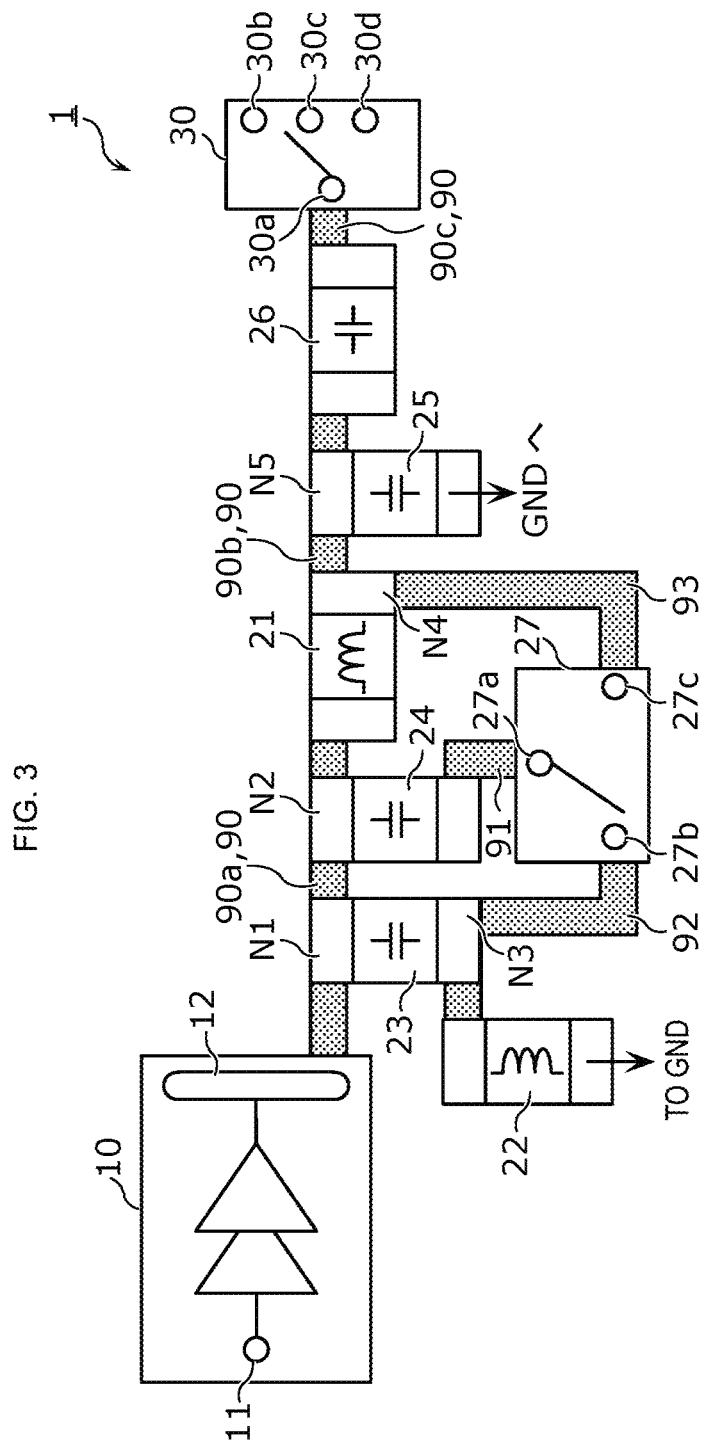
FIG. 3 is a plan view illustrating an example layout of circuit elements of the matching circuit of the high frequency circuit according to the exemplary embodiment.

An example layout of elements included in the matching circuit 20 will then be described by using FIG. 3. FIG. 3 is a plan view illustrating an example layout of circuit elements of the matching circuit 20 of the high frequency circuit 1 according to this exemplary embodiment. For example, FIG. 3 illustrates the layout of the circuit elements in a plan view of a main surface (not illustrated) of a module substrate on which the high frequency circuit 1 is provided. In the following description, the term "plan view" denotes a plan view of the main surface of the module substrate, unless otherwise stated. FIG. 3 also illustrates the power amplifier 10 and the switch 30.

As illustrated in FIG. 3, the inductors 21 and 22 are each formed from a chip component (chip inductor). For example, the one end of and the other end of the inductor 21 are two respective terminal electrodes of the chip inductor and may each be regarded as a portion connected to any of a wiring conductor, a via conductor, and a connection terminal that are provided on the substrate. The chip inductor is shaped like, for example, a rectangle in the plan view and is provided with two terminal electrodes on both ends in the longitudinal direction. The two terminal electrodes are electrically connected in the chip inductor by using the wiring conductor or the via conductor. The same holds true for the inductor 22. The size and the shape of the chip inductor is not particularly limited.

The capacitors 23, 24, 25, and 26 are each formed from a chip component (chip capacitor). For example, the one end and the other end of the capacitor 23 are two respective terminal electrodes of the chip capacitor and may each be regarded as a portion connected to any of a wiring conductor, a via conductor, and a connection terminal that are provided on the substrate. The chip capacitor is shaped like, for example, a rectangle in the plan view and is provided with two terminal electrodes on both ends in the longitudinal direction. The two terminal electrodes are electrically connected, in the chip capacitor, to a first electrode and a second electrode disposed parallel to each other and having a plate shape. The same holds true for the capacitors 24, 25, and 26. The size and the shape of the chip capacitor is not particularly limited.

The switch 27 is formed as an integrated circuit (IC) element. The IC element is formed in a semiconductor process using a semiconductor material such as Si, SiGe, SiC, GaAs, or GaN. Transistors included in the switch 27 are formed on the semiconductor substrate in the semiconductor process. The power amplifier 10 and the switch 30 are likewise formed as an IC element.

The circuit elements included in the matching circuit 20 are connected by using the transmission path 90 and wiring conductors 91, 92, and 93. As illustrated in FIG. 3, the transmission path 90 extends linearly and connects the output terminal 12 of the power amplifier 10 and the common terminal 30*a* of the switch 30 in the shortest distance. This may shorten the wiring length of the transmission path 90 and thus reduce signal loss.

The transmission path 90 includes wiring conductors 90*a*, 90*b*, and 90*c*. The wiring conductors 90*a*, 90*b*, and 90*c* are disposed side by side in such a manner as to extend linearly.

The wiring conductor 90*a* connects the output terminal 12 of the power amplifier 10 and the one end of the inductor 21. The output terminal 12 of the power amplifier 10 overlaps with one end of the wiring conductor 90*a* in the plan view and is in contact with the wiring conductor 90*a* in the overlapping portion. The one end of the inductor 21 overlaps with the other end of the wiring conductor 90*a* in the plan view and is in contact with the wiring conductor 90*a* in the overlapping portion.

The capacitors 23 and 24 are disposed in such a manner as to overlap with the wiring conductor 90*a* in the plan view. Specifically, the one end of the capacitor 23 and the one end of the capacitor 24 each overlap with the wiring conductor 90*a* in the plan view and are in contact with the wiring conductor 90*a* in the overlapping portion. Accordingly, the one end of the capacitor 23 coincides with the node N1, and the one end of the capacitor 24 coincides with the node N2. The length of wiring connecting the node N1 and the one end of the capacitor 23 and the length of wiring connecting the node N2 and the one end of the capacitor 24 are each made short. This enables the generation of an unnecessary parasitic inductor or unnecessary parasitic capacitance to be reduced and thus enables signal loss to be reduced.

The wiring conductor 90*b* connects the other end of the inductor 21 and the one end of the capacitor 26. The other end of the inductor 21 overlaps with one end of the wiring conductor 90*b* in the plan view and is in contact with the wiring conductor 90*b* in the overlapping portion. The one end of the capacitor 26 overlaps with the other end of the wiring conductor 90*b* in the plan view and is in contact with the wiring conductor 90*b* in the overlapping portion.

The capacitor 25 is disposed in such a manner as to overlap with the wiring conductor 90*b* in the plan view. Specifically, the capacitor 25 is disposed in such a manner that one end of the capacitor 25 overlaps with the wiring conductor 90*b* in the plan view and is in contact with the wiring conductor 90*b* in the overlapping portion. The one end of the capacitor 25 thus coincides with the node N5, and the length of wiring connecting the node N5 and the one end of the capacitor 25 is made short. This enables the generation of an unnecessary parasitic inductor or unnecessary parasitic capacitance to be reduced and thus enables signal loss to be reduced.

The wiring conductor 90*c* connects the other end of the capacitor 26 and the common terminal 30*a* of the switch 30. The other end of the capacitor 26 overlaps with one end of the wiring conductor 90*c* in the plan view and is in contact with the wiring conductor 90*c* in the overlapping portion. The common terminal 30*a* of the switch 30 overlaps with the other end of the wiring conductor 90*c* in the plan view and is in contact with the wiring conductor 90*c* in the overlapping portion.

The wiring conductor 91 connects the other end of the capacitor 24 and the common terminal 27*a* of the switch 27. The wiring conductor 91 is shaped like a vertically and horizontally reversed L (a shape in which two lines are connected at a right angle) in the plan view. The other end of the capacitor 24 overlaps with one end of the wiring conductor 91 in the plan view and is in contact with the wiring conductor 91 in the overlapping portion. The common terminal 27*a* of the switch 27 overlaps with the other end of the wiring conductor 91 in the plan view and is in contact with the wiring conductor 91 in the overlapping portion.

The wiring conductor 92 connects the one end of the inductor 22 and the selection terminal 27*b* of the switch 27. The wiring conductor 92 is shaped like a crank in the plan view (a shape having two lines extending from two respective ends of a line and extending in opposite directions). The one end of the inductor 22 overlaps with one end of the wiring conductor 92 in the plan view and is in contact with the wiring conductor 92 in the overlapping portion. The selection terminal 27*b* of the switch 27 overlaps with the other end of the wiring conductor 92 in the plan view and is in contact with the wiring conductor 92 in the overlapping portion.

The capacitor 23 is disposed in such a manner as to overlap with the wiring conductor 92 in the plan view. Specifically, the other end of the capacitor 23 overlaps with a bending portion of the wiring conductor 92 in the plan view and is in contact with the wiring conductor 92 in the overlapping portion. The portion where the other end of the capacitor 23 overlaps with the wiring conductor 92 is the node N3. That is, the other end of the capacitor 23 coincides with the node N3, and the length of wiring connecting the node N3 and the other end of the capacitor 23 is made short. This enables the generation of an unnecessary parasitic inductor or unnecessary parasitic capacitance to be reduced and thus enables signal loss to be reduced.

The wiring conductor 93 connects the selection terminal 27*c* of the switch 27 and the other end of the inductor 21. The wiring conductor 93 is shaped like a horizontally reversed L in the plan view. The selection terminal 27*c* of the switch 27 overlaps with one end of the wiring conductor 93 in the plan view and is in contact with the wiring conductor 93 in the overlapping portion. The other end of the inductor 21 overlaps with the other end of the wiring conductor 93 in the plan view and is in contact with the wiring conductor 93 in the overlapping portion.

The wiring conductors 90a, 90b, 90c, 91, 92, and 93 are each formed from a conductive material such as a metal. For example, the wiring conductors 90a, 90b, 90c, 91, 92, and 93 are provided on the surface of the module substrate or inside the module substrate. The wiring conductors 90a, 90b, 90c, 91, 92, and 93 may be provided on or in the same wiring layer. The wiring conductors 90a, 90b, 90c, 91, 92, and 93 may also be provided on or in two or more different wiring layers and may be connected to each other with a via conductor penetrating at least part of the module substrate.

As described above, providing the transmission path 90 linearly enables signal loss to be reduced. In addition, if the circuit elements are disposed as close to each other as possible, and if the wiring conductors 91, 92, and 93 are made short, the area of the matching circuit 20 may thereby be decreased, and the high frequency circuit 1 may be downsized.

In this exemplary embodiment, the capacitor 24 is disposed farther from the output terminal 12 of the power amplifier 10 than the capacitor 23 is. Specifically, a wiring distance between the output terminal 12 of the power amplifier 10 and the capacitor 23 is shorter than a wiring distance between the output terminal 12 and the capacitor 24.

Since the capacitor 24 is connected to the switch 27 and thus influenced by the on resistance of the switch 27, the capacitor 24 has a lower Q value than the capacitor 23 does. Accordingly, if the capacitor 23 having the higher Q value than that of the capacitor 24 is connected to the output terminal 12 of the power amplifier 10 having lower impedance at a short distance, a harmonic wave attenuation effect by the matching circuit 20 and impedance matching accuracy may thereby be enhanced. Loss of a signal transmitted through the transmission path 90 may be reduced.

The layout of the circuit element illustrated in FIG. 3 is merely an example and is not limited. The shape of each of the wiring conductors 90a, 90b, 90c, 91, 92, and 93 in the plan view is not particularly limited. For example, at least one of the capacitors 23 and 24 does not have to overlap with the wiring conductor 90a in the plan view. A wiring conductor extending from the node N1 or N2 of the wiring conductor 90a may be provided, and the one end of the capacitor 23 or 24 may be connected to the wiring conductor. The same holds true for the capacitor 25, and the capacitor 25 does not have to overlap with the wiring conductor 90b in the plan view.

For example, the other end of the wiring conductor 93 may be connected to a portion, of the wiring conductor 90b, not overlapping with any of the other end of the inductor 21 and the one end of the capacitor 25. That is, the other end of the inductor 21 does not have to overlap with the wiring conductor 93 in the plan view.

FIG. 3 illustrates the example in which each of the inductors 21 and 22 and the capacitors 23, 24, 25, and 26 is formed from a chip component; however, the configuration is not limited to this. For example, at least one of the inductors 21 and 22 may be formed from at least part of a wiring conductor or via conductor provided on or in the substrate. In other words, at least one of the inductors 21 and 22 may be a parasitic inductor component of the wiring conductor or via conductor. For example, the inductor 22 may be a wiring conductor or via conductor provided on or in the substrate. This enables the number of elements of the high frequency circuit 1 to be reduced further.

For example, at least one of the capacitors 23, 24, 25, and 26 may be formed by using a plurality of conductors provided on and in the substrate. In other words, at least one of the capacitors 23, 24, 25, and 26 may be a parasitic capacitance component generated between the plurality of conductors.

4 Modifications

Modifications of the high frequency circuit 1 according to the exemplary embodiment will then be described by using FIGS. 4 to 10. The following description focuses on differences from the exemplary embodiment, and common points are omitted or simplified.

4.1 Modification 1

Figure 4:
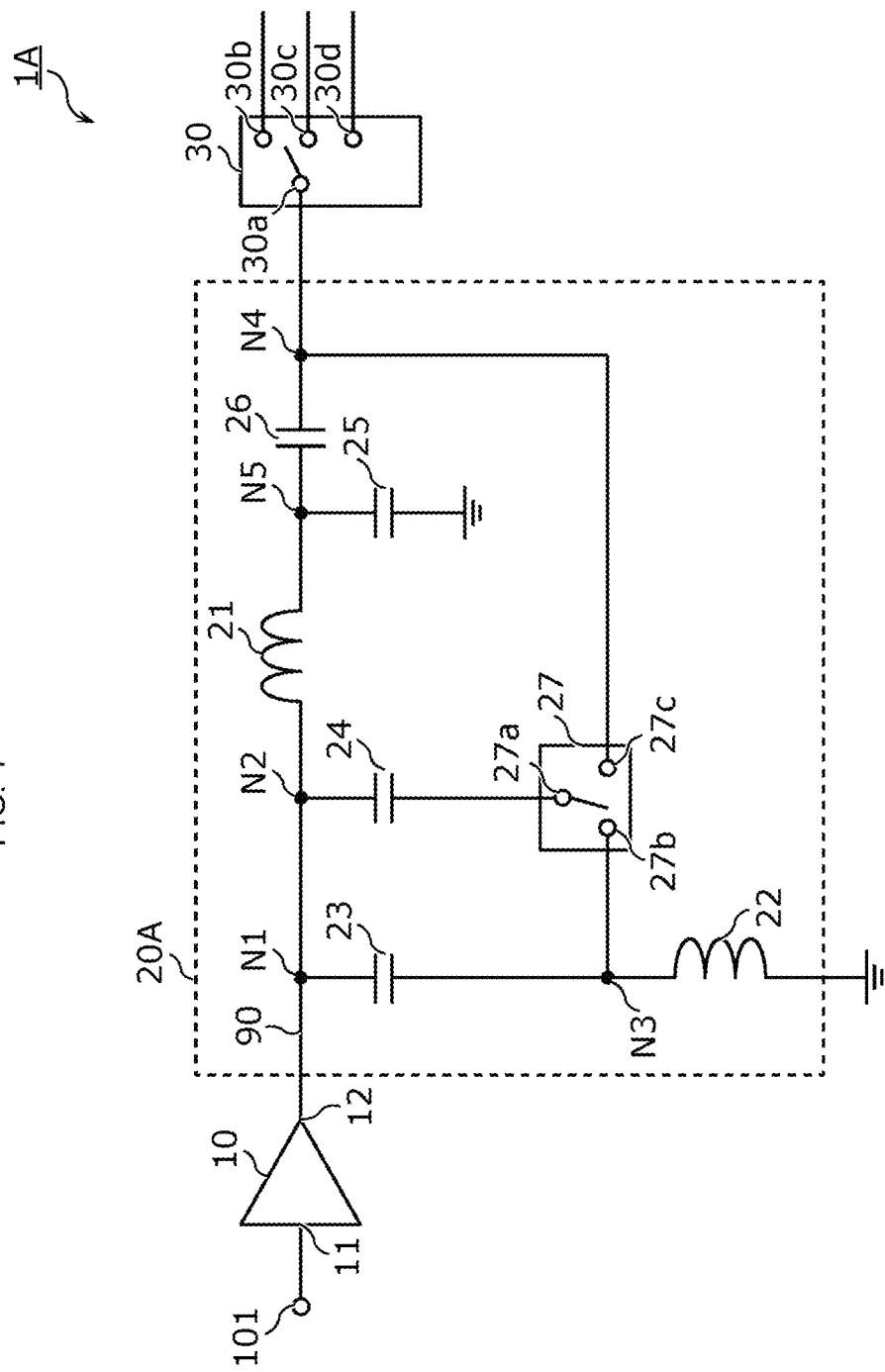
FIG. 4 is a circuit diagram of a matching circuit of a high frequency circuit according to Modification 1 of the exemplary embodiment.

First, a high frequency circuit 1A according to Modification 1 will be described by using FIG. 4. FIG. 4 is a circuit diagram of a matching circuit 20A of the high frequency circuit 1A according to Modification 1.

The high frequency circuit 1A illustrated in FIG. 4 includes the matching circuit 20A in place of the matching circuit 20 of the high frequency circuit 1. The matching circuit 20A is different from the matching circuit 20 in a connection target for the selection terminal 27c of the switch 27.

Specifically, the selection terminal 27c is connected to the other end of the inductor 21 with the capacitor 26 interposed therebetween. The selection terminal 27c is thus directly connected to the other end of the capacitor 26 and the common terminal 30a of the switch 30.

In other words, the position of the node N4, on the transmission path 90, to which the selection terminal 27c is connected is different from that in the high frequency circuit 1 illustrated in FIG. 2. The node N4 is located between the capacitor 26 and the common terminal 30a of the switch 30.

As described above, in the high frequency circuit 1A according to this modification, the matching circuit 20A has the capacitor 26 connected between the other end of the inductor 21 and the selection terminal 27c and to the transmission path 90. The selection terminal 27c is thus connected to the other end of the inductor 21 with the capacitor 26 interposed therebetween.

As described above, even if the position of the selection terminal 27c on transmission path 90 is changed, both of reducing the number of elements and improving the transmission characteristics may be achieved, like the embodiment.

4.2 Modification 2

Figure 5:
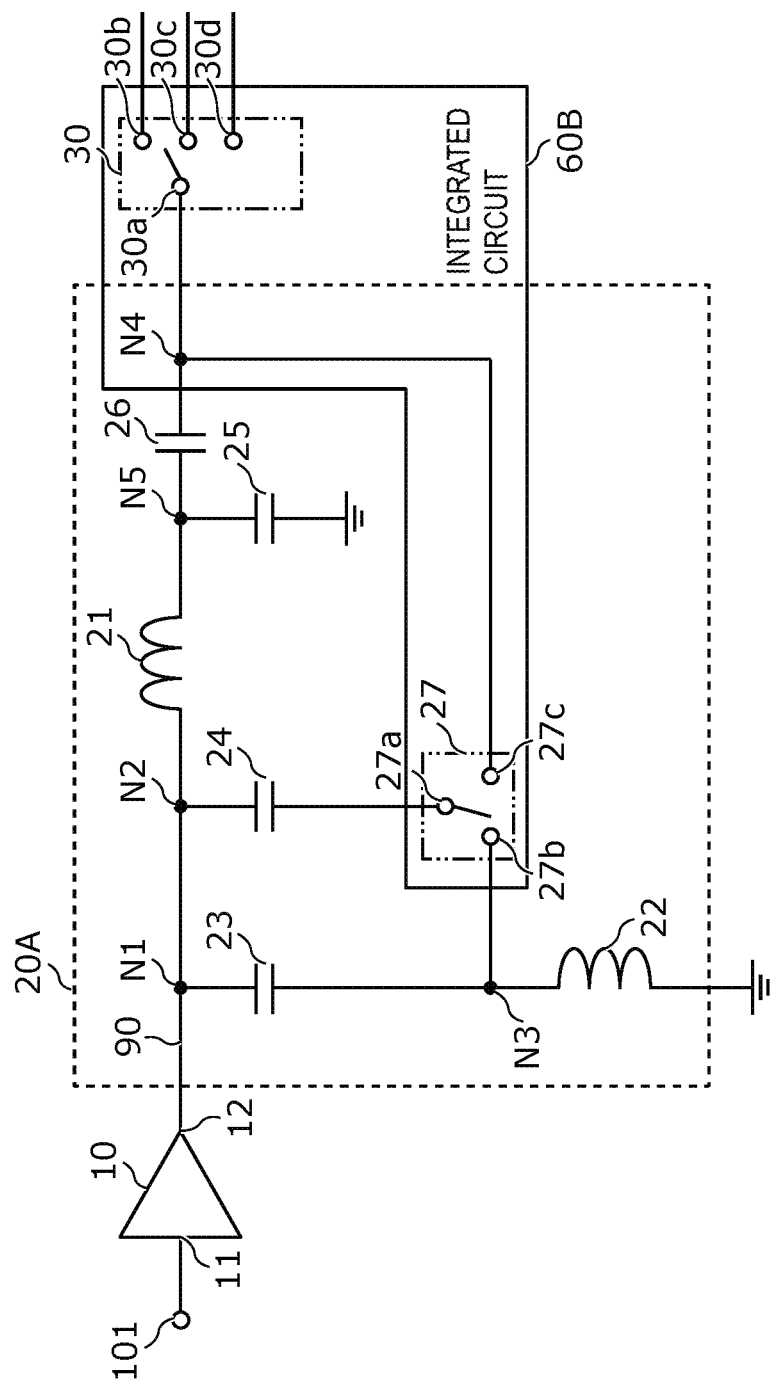
FIG. 5 is a circuit diagram of the matching circuit of a high frequency circuit according to Modification 2 of the exemplary embodiment.

A high frequency circuit 1B according to Modification 2 will then be described by using FIG. 5. FIG. 5 is a circuit diagram of the matching circuit 20A of the high frequency circuit 1B according to Modification 2.

The high frequency circuit 1B illustrated in FIG. 5 has the same circuit configuration as that of the high frequency circuit 1A according to Modification 1. In this modification, the switches 27 and 30 are formed as an integrated circuit 60B.

Integrating the plurality of switches 27 and 30 into one thereby enables the high frequency circuit 1B to be downsized.

Since the selection terminal 27c of the switch 27 and the common terminal 30a of the switch 30 are directly connected, a wiring conductor connecting the selection terminal 27c and the common terminal 30a can also be formed within the integrated circuit 60B. Since the number of external connection terminals provided in the integrated circuit 60B may thus be reduced, the reduction may contribute to further downsizing.

The circuit configuration of the high frequency circuit 1B according to this modification may be the same as that of the high frequency circuit 1. The selection terminal 27c may thus be directly connected to the other end of the inductor 21.

4.3 Modification 3

Figure 6:
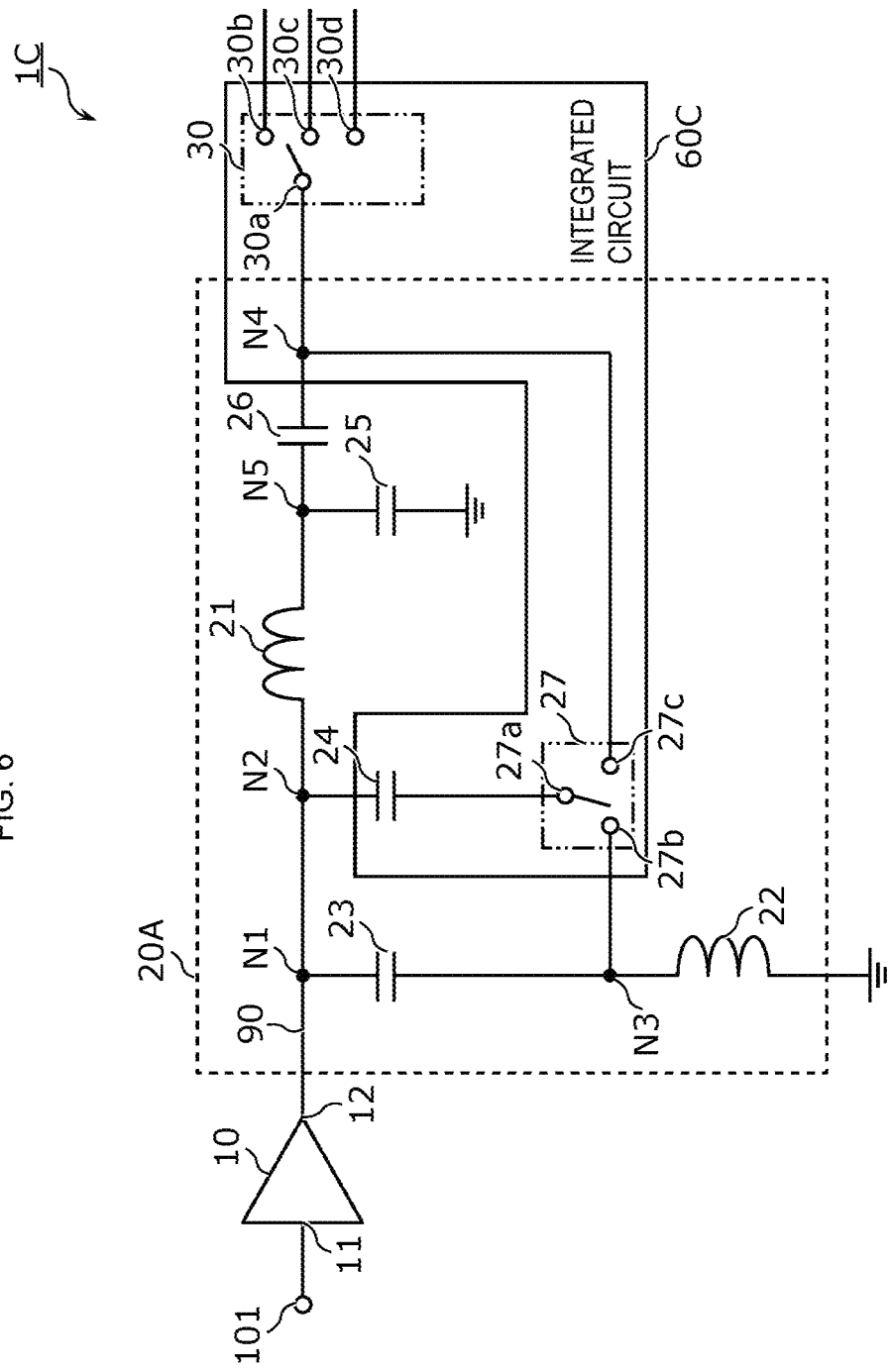
FIG. 6 is a circuit diagram of the matching circuit of a high frequency circuit according to Modification 3 of the exemplary embodiment.

A high frequency circuit 1C according to Modification 3 will then be described by using FIG. 6. FIG. 6 is a circuit diagram of the matching circuit 20A of the high frequency circuit 1C according to Modification 3.

The high frequency circuit 1C illustrated in FIG. 6 includes an integrated circuit 60C in place of the integrated circuit 60B of the high frequency circuit 1B according to Modification 2. The integrated circuit 60C includes not only the switches 27 and 30 but also the capacitor 24. In other words, the switches 27 and 30 and the capacitor 24 are formed as the one integrated circuit 60C.

This enables the high frequency circuit 1C to be downsized further.

At least one of the capacitors 23, 25, and 26 may be formed in the integrated circuit 60C in place of the capacitor 24 or in addition to the capacitor 24.

In the integrated circuit 60C, the switch 27 and the capacitor 24 may be formed, and the switch 30 does not have to be formed. Alternatively, the capacitor 24 may be formed in a control IC that controls the power amplifier 10. The same holds true for the capacitors 23, 25, and 26.

4.4 Modification 4

Figure 7:
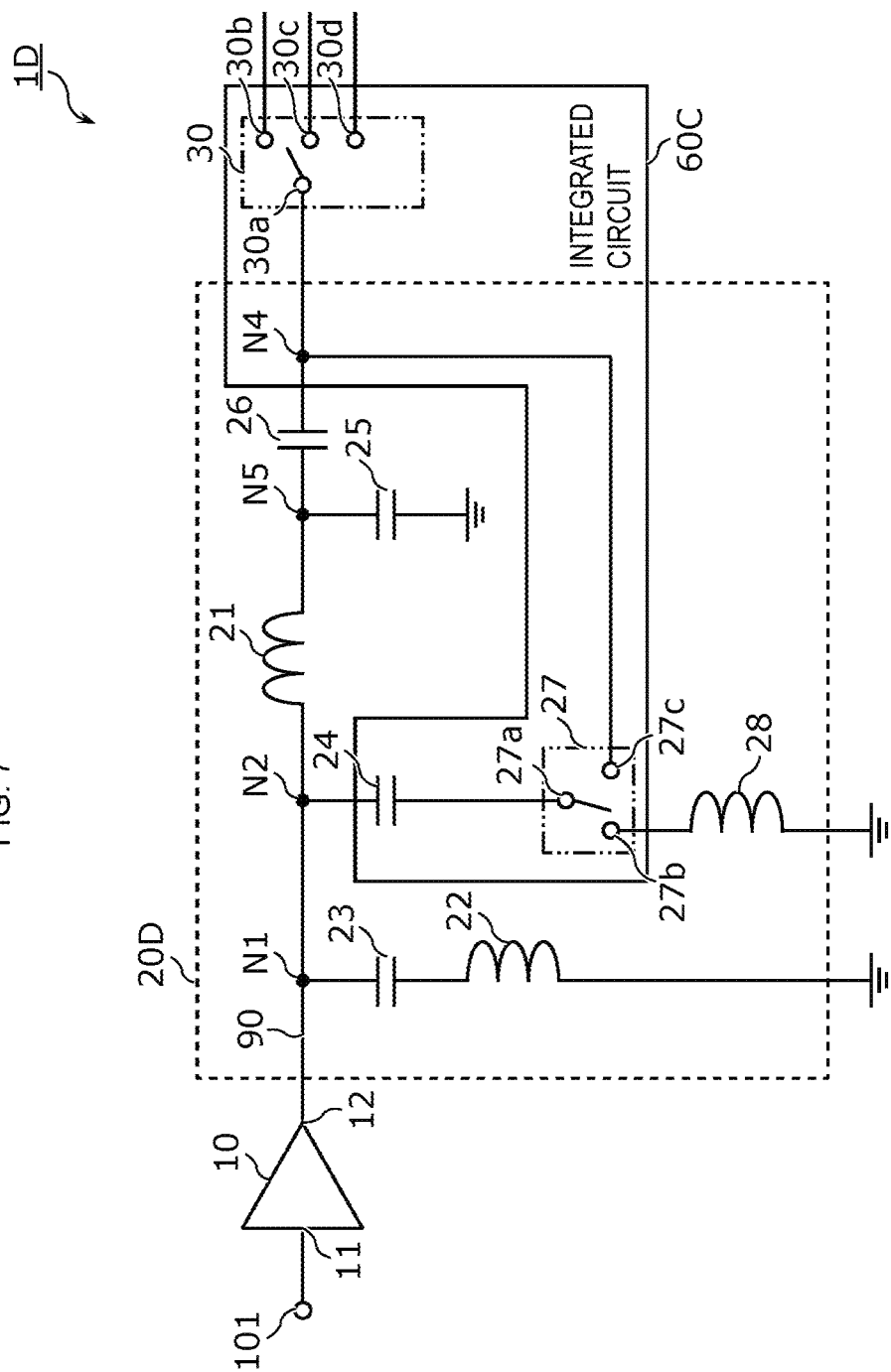
FIG. 7 is a circuit diagram of a matching circuit of a high frequency circuit according to Modification 4 of the exemplary embodiment.

A high frequency circuit 1D according to Modification 4 will then be described by using FIG. 7. FIG. 7 is a circuit diagram of a matching circuit 20D of the high frequency circuit 1D according to Modification 4.

The high frequency circuit 1D illustrated in FIG. 7 includes the matching circuit 20D in place of the matching circuit 20A of the high frequency circuit 1C according to Modification 3. The matching circuit 20D is different from the matching circuit 20A in inclusion of an inductor 28 and a connection target for the selection terminal 27b of the switch 27.

Specifically, the selection terminal 27b is connected to one end of the inductor 28. In other words, the selection terminal 27b is connected to the ground with the inductor 28 interposed therebetween. The inductor 28 is an example of a third inductor and is connected in series to and between the selection terminal 27b and the ground.

If the common terminal 27a and the selection terminal 27b are connected, an LC resonant circuit (notch filter) formed by the capacitor 24 and the inductor 28 is added to the shunt path. A more appropriate attenuation pole may thus be set easily. This enables the attenuation or the like of the sending signal and the deterioration of the transmission characteristics to be reduced.

The inductor 28 may be formed from a chip component and may be a parasitic inductor component of a wiring conductor or via conductor.

4.5 Modification 5

Figure 8:
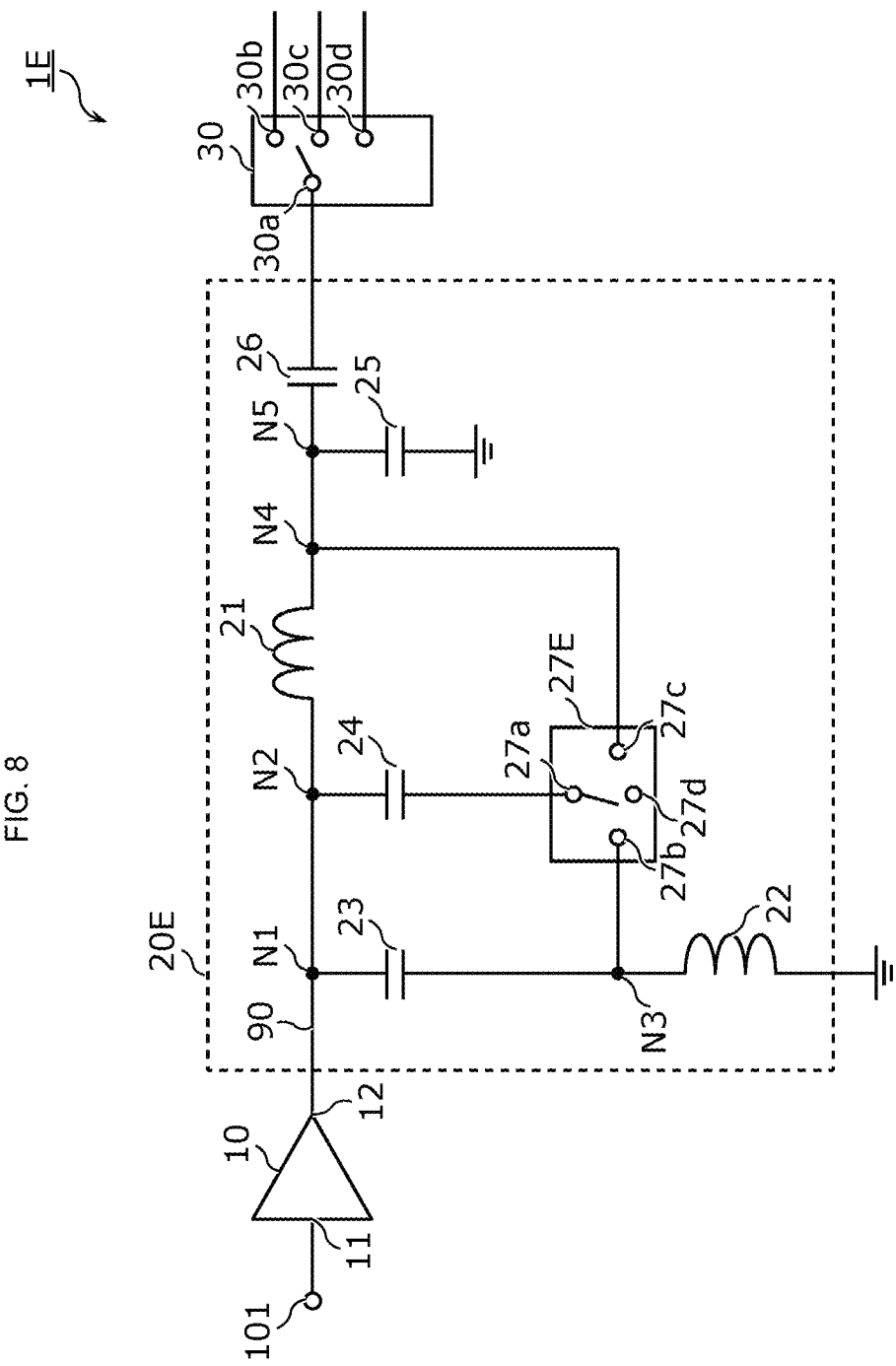
FIG. 8 is a circuit diagram of a matching circuit of a high frequency circuit according to Modification 5 of the exemplary embodiment.

A high frequency circuit 1E according to Modification 5 will then be described by using FIG. 8. FIG. 8 is a circuit diagram of a matching circuit 20E of the high frequency circuit 1E according to Modification 5.

The high frequency circuit 1E illustrated in FIG. 8 includes the matching circuit 20E in place of the matching circuit 20 of the high frequency circuit 1 according to the embodiment. The matching circuit 20E is different from the matching circuit 20 in inclusion of a switch 27E in place of the switch 27.

The switch 27E has a selection terminal 27d in addition to the configuration of the switch 27. The selection terminal 27d is an example of a third selection terminal and is not connected to any of the transmission path 90 and the ground. For example, the potential of the selection terminal 27d is not fixed but floating.

The switch 27E performs switching between connection (conduction) and non-connection (non-conduction) of the common terminal 27a to one of the selection terminals 27b, 27c, and 27d. The switch 27E is a SP3T switch circuit.

When connecting the common terminal 27a to the selection terminal 27d, the switch 27E is thereby able to be in a state of not connecting to any of the selection terminals 27b and 27c. In this case, the other end of the capacitor 24 connected to the common terminal 27a is floating without being connected to any of the transmission path 90 and the shunt path. Since a circuit in which the capacitor 24 is excluded from the circuit configuration of the matching circuit 20E can be formed, the circuit configuration patterns enabling the matching circuit 20E may be increased, and appropriate impedance matching and attenuation pole occurrence may be achieved based on the communication band or the power of a sending signal.

If the common terminal 27a is not connected to any of the selection terminals 27b, 27c, and 27d, the matching circuit 20E operates unstably on occasions. For example, the switch 27E possibly malfunctions in response to the fluctuation of a voltage or current supplied to a control terminal (not illustrated) of the switch 27E, and the common terminal 27a is possibly connected to one of the selection terminal 27b and the selection terminal 27c. In this case, the impedance of the matching circuit 20E is changed, and the change could lead to the deterioration of the transmission characteristics such as signal loss.

In the high frequency circuit 1E according to this modification, the common terminal 27a of the switch 27E is connected to the selection terminal 27d, and thereby the occurrence of the malfunction in which the common terminal 27a is connected to the selection terminal 27b or 27c may be reduced. This stabilizes the impedance of the matching circuit 20E and enables the deterioration of the transmission characteristics to be reduced.

4.6 Modification 6

Figure 9:
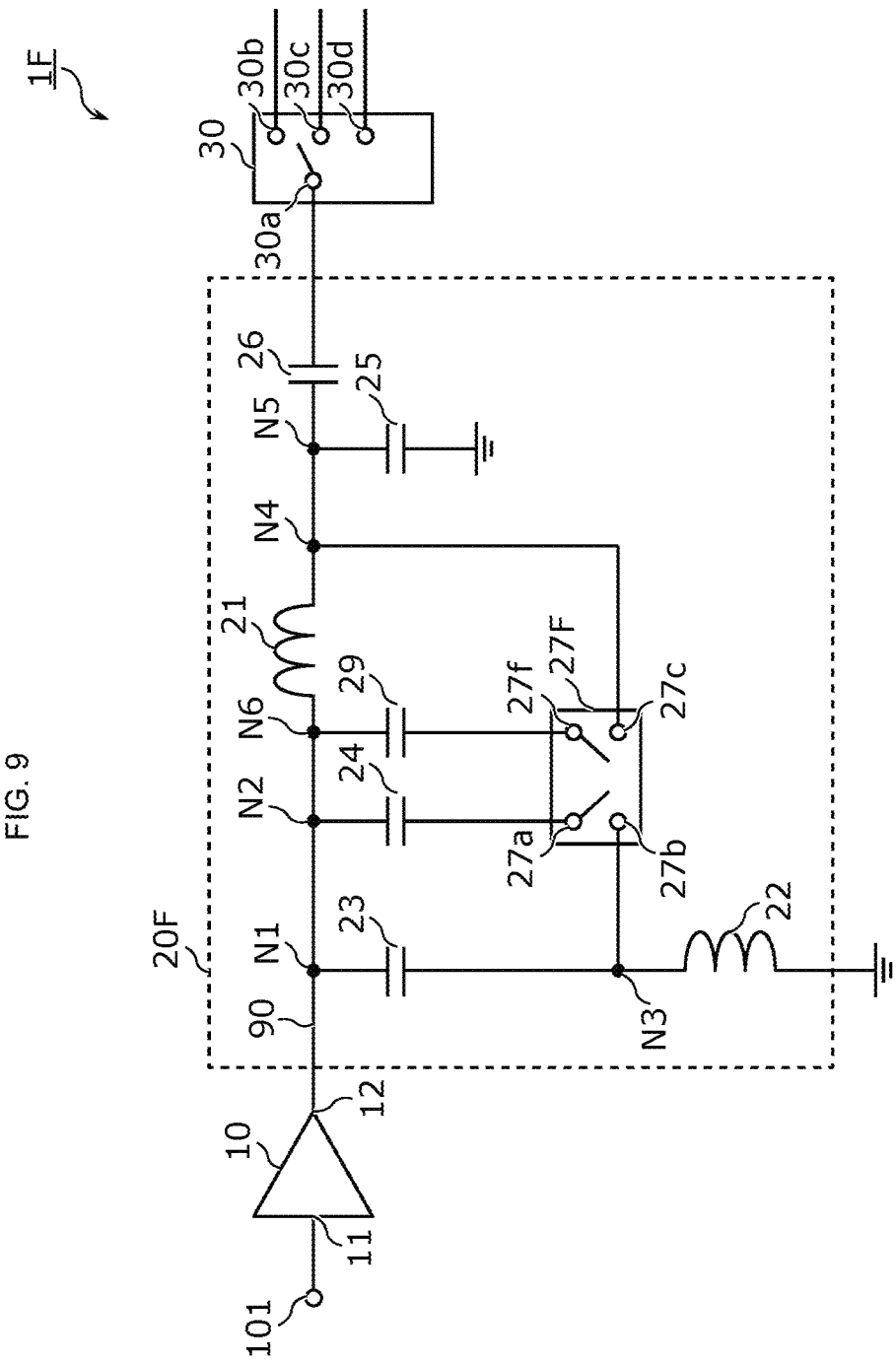
FIG. 9 is a circuit diagram of a matching circuit of a high frequency circuit according to Modification 6 of the exemplary embodiment.

A high frequency circuit 1F according to Modification 6 will then be described by using FIG. 9. FIG. 9 is a circuit diagram of a matching circuit 20F of the high frequency circuit 1F according to Modification 6.

The high frequency circuit 1F illustrated in FIG. 9 includes the matching circuit 20F in place of the matching circuit 20 of the high frequency circuit 1 according to the embodiment. The matching circuit 20F is different from the matching circuit 20 in inclusion of a switch 27F in place of the switch 27 and further inclusion of a capacitor 29.

The switch 27F has a common terminal 27f in addition to the configuration of the switch 27. The switch 27F performs switching between connection (conduction) and non-connection (non-conduction) of each of the common terminals 27a and 27f to one of the selection terminal 27b and the selection terminal 27c. The switch 27F is a double-pole double-throw (DPDT) switch circuit.

For example, the switch 27F is able to perform switching in the following four cases. The four cases are: Case (i) where each of the common terminals 27a and 27f is connected to the selection terminal 27b; Case (ii) where each of the common terminals 27a and 27f is connected to the selection terminal 27c; Case (iii) where the common terminal 27a is connected to the selection terminal 27b, and the common terminal 27f is connected to the selection terminal 27c; and Case (iv) where the common terminal 27a is connected to the selection terminal 27c, and the common terminal 27f is connected to the selection terminal 27b.

This enables each of the capacitors 24 and 29 to function as a series element or a shunt element. Specifically, in Case (i), both of the capacitors 24 and 29 function as the shunt element. In Case (ii), both of the capacitors 24 and 29 function as the series elements. In Cases (iii) and (iv), one of the capacitors 24 and 29 functions as the shunt element, and the other one functions as the series element. As described above, the circuit configuration patterns of the matching circuit 20F may be increased, and thus appropriate impedance matching and attenuation pole occurrence may be achieved based on the communication band or the power of a sending signal.

Like the switch 27E according to Modification 5, the switch 27F may have the selection terminal 27d. The common terminals 27a and 27f may also be connectable to the selection terminal 27d. This enables the circuit configuration patterns of the matching circuit 20F to be increased further.

The capacitor 29 is an example of a second capacitor and is connected in series to and between the common terminal 27f of the switch 27F and the one end of the inductor 21. Specifically, one end of the capacitor 29 is directly connected to a node N6 on the transmission path 90. The other end of the capacitor 29 is directly connected to the common terminal 27f of the switch 27F.

The capacitor 29 has a capacitance value different from, for example, that of the capacitor 24. This enables different impedances of the matching circuit 20F in Cases (iii) and (iv) above. The capacitor 29 may have as high a capacitance value as that of the capacitor 24.

The capacitor 29 is formed from, for example, a chip component (chip capacitor); however, the configuration is not limited to this. The capacitor 29 may be formed by using a plurality of conductors provided on and in the substrate. Alternatively, the capacitor 29 may be formed together with the switch 27F as one integrated circuit element, like the capacitor 24 described in Modification 3.

The node N6 is a branch point on the electric circuit. The node N6 is formed from, for example, part of a wiring conductor or via conductor or a connection terminal. The node N6 is located on the transmission path 90 for a signal amplified by the power amplifier 10. Specifically, the node N6 is located on the transmission path 90 and between the output terminal 12 of the power amplifier 10 and the one end of the inductor 21.

The node N6 may be provided at a position different from the illustrated position as long as the potential thereof is regarded as electrically the same. For example, the node N6 may be located between the node N1 and the capacitor 23 or between the node N2 and the capacitor 24. Alternatively, the node N6 may be located between the output terminal 12 and the node N1 or between the node N1 and the node N2. The node N6 may also be the same as that of at least one of the nodes N1 and N2.

4.7 Modification 7

Figure 10:
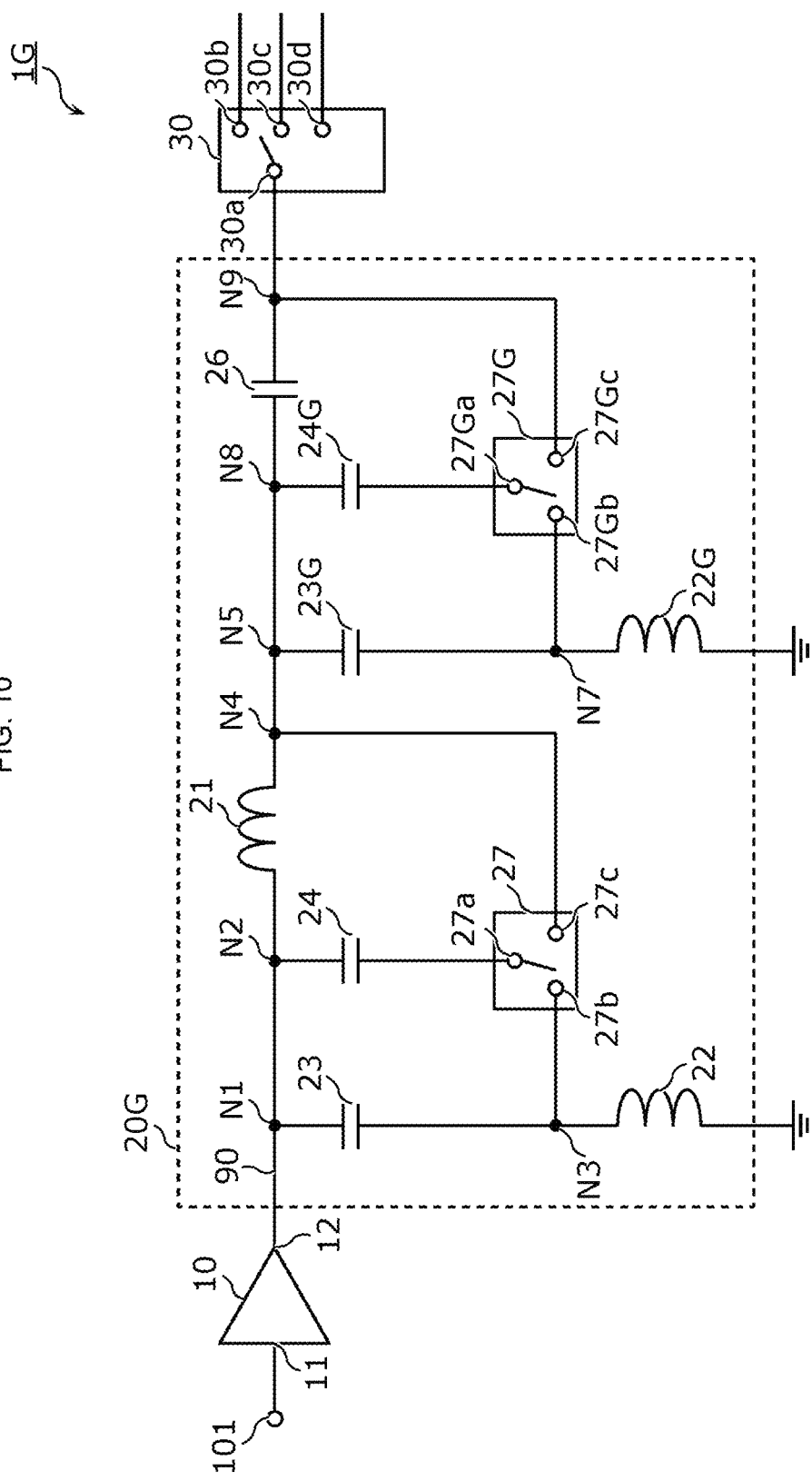
FIG. 10 is a circuit diagram of a matching circuit of a high frequency circuit according to Modification 7 of the exemplary embodiment.

A high frequency circuit 1G according to Modification 7 will then be described by using FIG. 10. FIG. 10 is a circuit diagram of a matching circuit 20G of the high frequency circuit 1G according to Modification 7.

The high frequency circuit 1G illustrated in FIG. 10 includes the matching circuit 20G in place of the matching circuit 20 of the high frequency circuit 1 according to the exemplary embodiment. The matching circuit 20G is different from the matching circuit 20 in inclusion of an inductor 22G, capacitors 23G and 24G, and a switch 27G in place of the capacitor 25.

As illustrated in FIG. 10, a connection relationship among the inductor 22G, the capacitors 23G and 24G, and the switch 27G is the same as a connection relationship among the inductor 22, the capacitors 23 and 24, and the switch 27. The switch 27G has a common terminal 27Ga and selection terminals 27Gb and 27Gc, like the switch 27. The switch 27G is capable of operating in the same manner as in the switch 27. The switch 27G may have the selection terminal 27d, like the switch 27E.

The matching circuit 20G is provided with the node N5 and nodes N7, N8, and N9 respectively correspond to the nodes N1, N2, N3, and N4. The capacitor 26 is connected in series to the transmission path 90, in place of the inductor 21 connected in series to the transmission path 90. Specifically, one end of the capacitor 24G is connected to the one end (node N8) of the capacitor 26. The selection terminal 27Gc of the switch 27G is connected to the other end (node N9) of the capacitor 26.

This enables the capacitor 24G to be shared for the two uses, that is, for the series connection and the shunt connection, like the capacitor 24 and thus enables the number of elements to be reduced. In addition, the number of patterns of the circuit configuration of the matching circuit 20G may be increased by changing the connection form of the capacitor 24G and thus more appropriate impedance matching may be performed based on the communication band or the power of the sending signal. As described above, the high frequency circuit 1G enables both of reducing the number of elements and improving the transmission characteristics.

Others

The high frequency circuits and the communication apparatuses according to the present disclosure have heretofore been described based on the embodiment above and the like, and the present disclosure is not limited to the embodiment above.

For example, the one end of the capacitor 23 and the one end of the capacitor 24 may be connected to the other end of the inductor 21 (a terminal closer to the switch 30). In this case, the selection terminal 27c of the switch 27 is connected to the one end of the inductor 21 (the output terminal 12 of the power amplifier 10). Accordingly, the nodes N1 and N2 may be located on the transmission path 90 and between the inductor 21 and the switch 30, and the node N4 may be located on the transmission path 90 and between the output terminal 12 and the inductor 21.

For example, the power amplifier 10 may amplify a receiving signal, not a sending signal. The transmission path 90 may thus be a transmission path through which the receiving signal is transmitted.

The features of the high frequency circuits and the communication apparatuses described based on the exemplary embodiment and the modifications above are hereinafter described.

<1>

A high frequency circuit includes:
a power amplifier; and
a matching circuit connected to an output terminal of the power amplifier.
The matching circuit includes
a first inductor connected in series to an output transmission path of the power amplifier,
a first capacitor connected in series to and between an end of the first inductor and ground,
a second inductor connected in series to and between the first capacitor and the ground,
a first switch having a first common terminal, a first selection terminal, and a second selection terminal, and
a second capacitor connected in series to and between the first common terminal and the end of the first inductor.
The first selection terminal is connected to the ground.
The second selection terminal is connected to a different end of the first inductor.

<2>

In the high frequency circuit according to <1>,
the first selection terminal is connected to the ground with the second inductor interposed between the first selection terminal and the ground.

<3>

In the high frequency circuit according to <1>,
the matching circuit includes a third inductor connected in series to and between the first selection terminal and the ground.

<4>

In the high frequency circuit according to any one of <1> to <3>,
the second inductor is one of a wiring conductor and a via conductor that is provided on or in a substrate.

<5>

In the high frequency circuit according to any one of <1> to <4>,
the matching circuit includes a third capacitor connected between the different end of the first inductor and the second selection terminal and to the output transmission path.

<6>

The high frequency circuit according to any one of <1> to <5> includes:
a second switch including a second common terminal and a plurality of selection terminals.
The second common terminal is connected to the different end of the first inductor.

<7>

In the high frequency circuit according to <6>,
the first switch and the second switch are formed as one integrated circuit element.

<8>

In the high frequency circuit according to <7>,
the second capacitor is formed on the integrated circuit element.

<9>

In the high frequency circuit according to any one of <1> to <8>,
the first switch includes a third selection terminal not connected to either the output transmission path or the ground.

<10>

In the high frequency circuit according to any one of <1> to <9>,
a wiring distance between the output terminal of the power amplifier and the first capacitor is shorter than a wiring distance between the output terminal of the power amplifier and the second capacitor.

<11>

In the high frequency circuit according to any one of <1> to <10>,
the matching circuit includes a fourth capacitor connected in series to and between the different end of the first inductor and the ground.

<12>

A communication apparatus includes:
the high frequency circuit according to any one of <1> to <11>; and
a radio frequency (RF) signal processing circuit that processes a high frequency signal transmitted through the high frequency circuit.

<13>

The communication apparatus according to <12>, wherein the communication apparatus is a mobile phone and the high frequency circuit is a multiband/multimode front end circuit for the mobile phone.

<14>

The communication apparatus according to <13>, further comprising a base band circuit to process an output of the RF signal processing circuit.

<15>

The high frequency circuit according to any one of <1> to <11>, wherein the power amplified is configured to only amplify a received signal.

<16>

The high frequency circuit according to any one of <1> to <11>, wherein the power amplifier includes a heterojunction bipolar transistor (HBT) or a metal oxide semiconductor field effect transistor (MOSFET).

<17>

The high frequency circuit according to <16>, wherein the power amplifier is a multi-stage power amplifier including a plurality of transistors.

<18>

The high frequency circuit according to any one of <1> to <11>, further comprising:
one or more filters connected to an output of the matching circuit.

<19>

The high frequency circuit according to <18>, wherein the one or more filters include a surface acoustic wave (SAW) filter, a bulk acoustic wave (BAW) filter, an inductance/capacitance (LC) resonant filter, or a dielectric filter.

<20>

The high frequency circuit according to <18> or <19>, wherein a passband of the one or more filters is selected in accordance with a telecommunications standard.

In addition to the above-described exemplary embodiment, a mode obtained by making any of various modifications conceived of by those skilled in the art to the exemplary embodiment and a mode achieved by performing any combination of the components and the functions in the exemplary embodiment without departing from the spirit of the present disclosure are included in the embodiments of the present disclosure.

The present disclosure is usable, for example, as a multiband/multimode front end circuit, for example, for communication equipment such as a mobile phone.

What is claimed is:

1. A high frequency circuit comprising:
a power amplifier; and
a matching circuit connected to an output terminal of the power amplifier,
wherein the matching circuit includes
a first inductor connected in series to an output transmission path of the power amplifier,
a first capacitor connected in series to and between an end of the first inductor and ground,
a second inductor connected in series to and between the first capacitor and the ground,
a first switch having a first common terminal, a first selection terminal, and a second selection terminal, and
a second capacitor connected in series to and between the first common terminal and the end of the first inductor,
wherein the first selection terminal is connected to the ground, and
wherein the second selection terminal is connected to a different end of the first inductor.

2. The high frequency circuit according to claim 1,
wherein the first selection terminal is connected to the ground with the second inductor interposed between the first selection terminal and the ground.

3. The high frequency circuit according to claim 1,
wherein the matching circuit includes a third inductor connected in series to and between the first selection terminal and the ground.

4. The high frequency circuit according to claim 1,
wherein the second inductor is one of a wiring conductor and a via conductor that is provided on or in a substrate.

5. The high frequency circuit according to claim 1,
wherein the matching circuit includes a third capacitor connected between the different end of the first inductor and the second selection terminal and to the output transmission path.

6. The high frequency circuit according to claim 1, comprising:
a second switch including a second common terminal and a plurality of selection terminals,
wherein the second common terminal is connected to the different end of the first inductor.

7. The high frequency circuit according to claim 6,
wherein the first switch and the second switch are formed as one integrated circuit element.

8. The high frequency circuit according to claim 7,
wherein the second capacitor is formed on the integrated circuit element.

9. The high frequency circuit according to claim 1,
wherein the first switch includes a third selection terminal not connected to either the output transmission path or the ground.

10. The high frequency circuit according to claim 1,
wherein a wiring distance between the output terminal of the power amplifier and the first capacitor is shorter than a wiring distance between the output terminal of the power amplifier and the second capacitor.

11. The high frequency circuit according to claim 1,
wherein the matching circuit includes a fourth capacitor connected in series to and between the different end of the first inductor and the ground.

12. A communication apparatus comprising:
the high frequency circuit according to claim 1; and
a radio frequency (RF) signal processing circuit that processes a high frequency signal transmitted through the high frequency circuit.

13. The communication apparatus according to claim 12,
wherein the communication apparatus is a mobile phone and the high frequency circuit is a multiband/multimode front end circuit for the mobile phone.

14. The communication apparatus according to claim 13,
further comprising a base band circuit to process an output of the RF signal processing circuit.

15. The high frequency circuit according to claim 1,
wherein the power amplified is configured to only amplify a received signal.

16. The high frequency circuit according to claim 1,
wherein the power amplifier includes a heterojunction bipolar transistor (HBT) or a metal oxide semiconductor field effect transistor (MOSFET).

17. The high frequency circuit according to claim 16,
wherein the power amplifier is a multi-stage power amplifier including a plurality of transistors.

18. The high frequency circuit according to claim 1, further comprising:
one or more filters connected to an output of the matching circuit.

19. The high frequency circuit according to claim 18,
wherein the one or more filters include a surface acoustic wave (SAW) filter, a bulk acoustic wave (BAW) filter, an inductance/capacitance (LC) resonant filter, or a dielectric filter.

20. The high frequency circuit according to claim 18,
wherein a passband of the one or more filters is selected in accordance with a telecommunications standard.

* * * * *